United States Patent [19]

Spence et al.

[11] 3,909,674

[45] Sept. 30, 1975

[54] PROTECTION CIRCUIT FOR MOS DRIVER

[75] Inventors: John R. Spence, Villa Park; Robert W. Polkinghorn, Orange, both of Calif.

[73] Assignee: Rockwell International Corporation, El Segundo, Calif.

[22] Filed: Mar. 28, 1974

[21] Appl. No.: 455,777

[52] U.S. Cl. .................. 317/16; 317/31; 317/33 SC; 307/202

[51] Int. Cl.² ........................ H02H 1/04; H02H 7/20

[58] Field of Search ....... 317/31, 33 VR, 33 SC, 16; 307/202, 251, 304, 205, 246; 357/22, 23, 41

[56] References Cited

UNITED STATES PATENTS

| | | | |
|---|---|---|---|
| 3,463,935 | 8/1969 | Rovell | 307/202 |
| 3,575,613 | 4/1971 | Ebertin | 307/251 X |
| 3,651,517 | 3/1972 | Kurek et al. | 307/251 X |
| 3,777,216 | 12/1973 | Armstrong | 317/31 |

OTHER PUBLICATIONS

Series N–Channel MOSFET Gate Protection CKT, Vol. 13, No. 9, Feb. 1971, IBM Tech. D. B.

*Primary Examiner*—J. D. Miller
*Assistant Examiner*—Patrick R. Salce
*Attorney, Agent, or Firm*—H. Frederick Hamann; G. Donald Weber, Jr.; Morland Charles Fischer

[57] ABSTRACT

An insulated-gate field effect transistor (IGFET) driver circuit, incorporated in a MOS chip, has a clamping capacitor connected through a switching device to the gate electrode of the driver IGFET when the chip is energized to minimize voltage feedback across the IGFET drain-to-gate capacitance ($C_{DG}$). When the chip is de-energized, the switching device isolates the clamping capacitor from the gate electrode to enhance the voltage feedback across $C_{DG}$ to protect the driver IGFET from static charges applied to the drain (output) electrode thereof.

8 Claims, 1 Drawing Figure

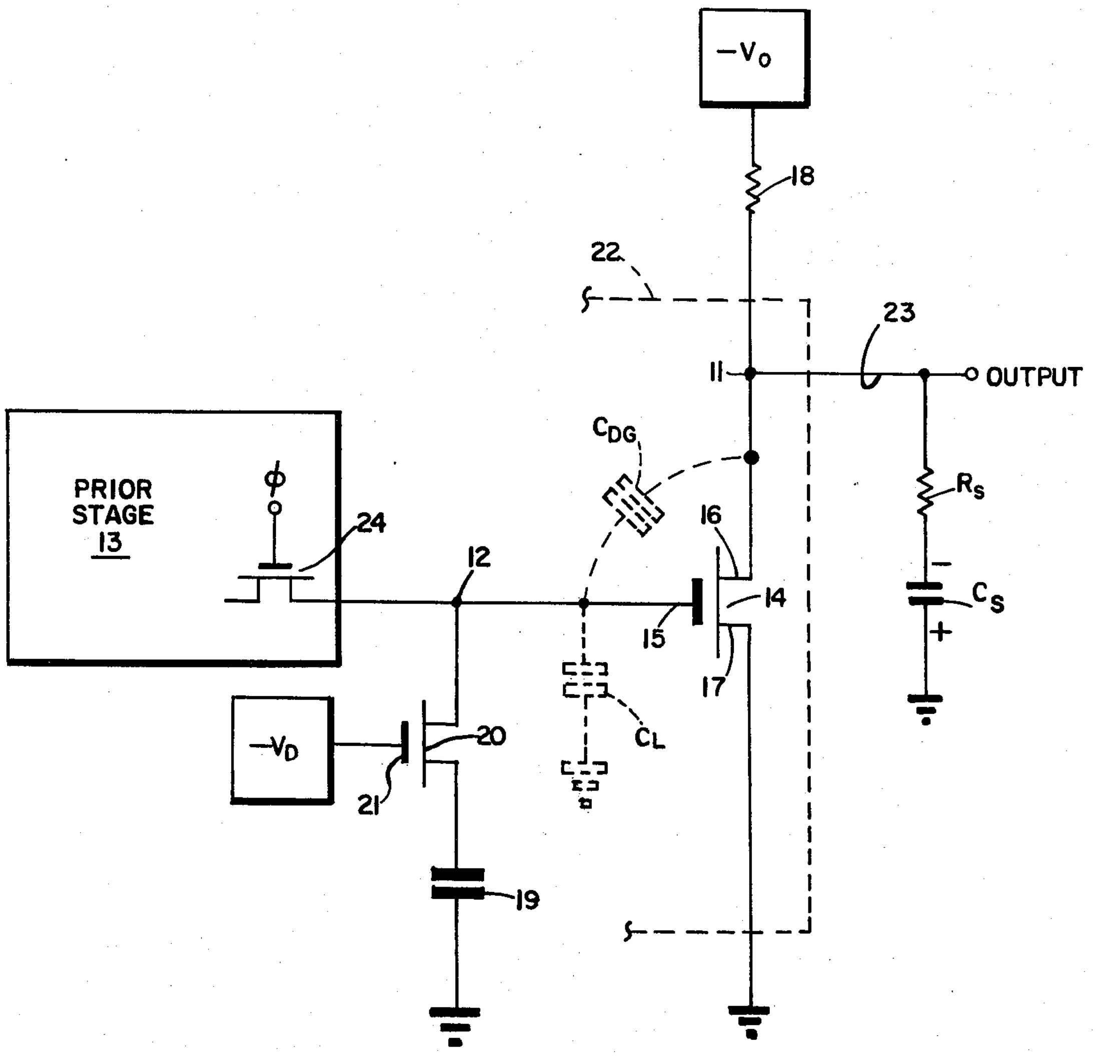
$-V_O$
18
22
23
11
OUTPUT
$C_{DG}$
$R_S$
PRIOR
STAGE
13
$\phi$
24
12
16
14
15
17
$C_S$
$C_L$
$-V_D$
20
21
19

PROTECTION CIRCUIT FOR MOS DRIVER

BACKGROUND OF THE INVENTION

1. Field of the Invention

This invention relates generally to MOS circuits and, more particularly, to apparatus for protecting MOS circuits from damage by spurious, high voltage signals.

2. Description of the Prior Art

The susceptibility of MOS devices, such as insulated-gate field effect transistors (IGFET's), to damage from excessive voltage signals resulting from static electric charges and the like is well known. Static charges may be built up on a MOS integrated circuit chip during the manufacture, shipping and handling thereof. If a static charge of sufficient magnitude is applied to the gate electrode of an IGFET, the thin gate dielectric will rupture causing permanent failure of the device. Typically, the IGFET gate electrode is employed as the input connection for a given circuit state, and a variety of input protection circuit arrangements have been developed to dissipate any static charge built up on the gate electrode to prevent gate dielectric rupture.

Static charge may also build up on the output (drain) electrode of an IGFET. In general, this presents a less severe problem due to an inherent feedback mechanism of the IGFET which tends to dissipate the charge before it can rupture the gate dielectric. In this regard, a capacitance ($C_{DG}$) exists between the IGFET drain and gate due to overlap between the gate electrode and the drain region. A voltage rise on the drain electrode due to static charge is fed back across $C_{DG}$ to the gate electrode causing an increase in the gate voltage. When the gate voltage level reaches the device threshold voltage, the device is turned on and the static charge at the drain electrode is discharged therethrough before it can reach a level sufficient to rupture the gate dielectric. The fraction of the total static charge fed back to the gate electrode is proportional to the fraction of the total gate capacitance represented by $C_{DG}$. (The total gate capacitance comprises the drain-gate capacitance ($C_{DG}$), the channel-gate capacitance ($C_{CG}$), and the source-gate capacitance ($C_{SG}$).) Typically, $C_{DG}$ may be about one-fourth of the total gate capacitance, so that for a given voltage increase of value V at the drain electrode, the gate voltage will increase by approximately ¼ V.

Unfortunately, however, in many MOS circuits, voltage feedback across $C_{DG}$ (often termed Miller feedback) interferes with normal circuit operation and can introduce errors in the voltage level supplied at the output of a circuit stage. This is particularly true for output driver stages of a MOS chip which must supply binary voltage levels to circuitry external to the chip. For example, in certain hand-held or desk-top calculators employing MOS circuit chips, the output driver stages are connected to drive the calculator display (e.g. liquid crystal, light emitting diodes, etc.), and unless accurate voltage levels are supplied by drivers, erroneous information would be displayed to the operator.

A principal cause for output voltage errors due to Miller feedback resides in the fact that after a prescribed voltage level is established at the gate electrode of a MOS device, the gate electrode is often electrically isolated, (i.e., left floating) at the prescribed voltage level. With the gate electrode electrically floating, Miller feedback voltages, or other noise signals coupled to the gate electrode, cause a shift in gate voltage which alters the conduction of the MOS device and correspondingly shifts the output signal level supplied by the device. For example, consider a P-channel IGFET in a grounded source configuration which conducts with a negative voltage level at its gate electrode to connect the output (drain) electrode to ground. The device is switched off by grounding the gate electrode enabling the drain voltage to increase toward a desired output negative level. The drain voltage increases relatively slowly (compared to the gate voltage) due to a relatively large R-C time constant in the output circuit. Since the gate electrode is electrically floating (at ground level), the fraction of the negative drain voltage increase which is fed back across $C_{DG}$ to the gate electrode is effective to drive the gate voltage negative. If the gate voltage level reaches the device threshold voltage, the device will be turned on and an erroneous output signal (approaching ground) will be supplied at the drain electrode.

As a result, in many MOS output drivers it has been necessary to minimize the voltage level fed back to the gate electrode. To this end, it has become common practice to connect a clamping capacitor between the gate electrode and a suitable reference potential source, e.g., ground. In this manner, the gate voltage is clamped closer to ground potential, so that feedback voltages are less likely to build up to a level sufficient to turn the device on, and the driver supplies a maximum output voltage level.

Unfortunately, however, use of a clamping capacitor in the above manner renders the MOS device even more susceptible to dielectric breakdown from static voltages and the like since it, in effect, decreases the fraction of the output voltage fed back to the gate electrode. As a result, a static charge level at the drain electrode must increase even further before the gate electrode reaches a level sufficient to turn on the device and discharge the static charge. Clearly, in this case, a greater voltage between gate and drain is built up across the gate dielectric which increases the likelihood of rupturing the dielectric before the charge can be dissipated. As a result, a circuit designer is faced with a trade-off between competing requirements for the generation of error free output voltages and for the prevention of static charge breakdown of the gate dielectric.

SUMMARY OF THE INVENTION

The present invention provides a new and improved MOS driver circuit providing a prescribed output drive voltage level while maintaining a high tolerance to dielectric breakdown from static charge or other spurious signals at the output (drain) electrode thereof. A clamping capacitor is selectively connected, by switching means, to the gate electrode of a driver MOS device to either enhance or minimize the voltage feedback from the device output (drain) electrode to the gate electrode thereof.

In a preferred embodiment, the switching means may comprise a switching MOS device conductive when the driver circuit is energized, to connect the capacitor to the driver device gate electrode to provide a minimum feedback voltage level. When the driver circuit is de-energized, the switching device turns off to isolate the capacitor from the driver device gate electrode thereby increasing the feedback level. Most damage from static charges occurs when a circuit is de-energized (i.e. when being handled with power off) and, as a result, isolating the capacitor at this time protects against static damage.

BRIEF DESCRIPTION OF THE DRAWING

The sole FIGURE is an electrical schematic diagram of a preferred embodiment of a protection circuit for a MOS driver in accordance with the present invention.

DESCRIPTION OF THE PREFERRED EMBODIMENT

As shown in the drawing for purposes of illustration, the invention is embodied in a MOS driver circuit for supplying a drive voltage signal to an output terminal 11 in response to input signals received at input terminal 12 from a suitable input device such as a prior circuit stage 13. The driver circuit includes a driver MOS device 14 having a gate (input) electrode 15 connected to input terminal 12, a drain (output) electrode 16 connected to output terminal 11, and a source electrode 17 connected to a suitable source of reference voltage (illustrated as ground). The drain electrode 16 of MOS device 14 is connected through a load resistor 18 to a supply voltage source designated $-V_0$, and output terminal 11 is located at the common point between device 14 and the load resistor.

As is known in the art, gate electrode 15 overlies the channel between the source and drain regions of device 14 and may partially overlie the source and drain regions. Thus, the gate capacitance of device 14 comprises the capacitance between the gate electrode and each of the source, drain, and channel regions. The drain-gate capacitance ($C_{DG}$) is shown in dashed outline between drain electrode 16 and gate electrode 15. The channel-gate and source-gate capacitances are shown collectively in dashed outline by lumped capacitor $C_L$ between the gate electrode and ground. The sum of $C_{DG}$ and $C_L$ represents the total gate capacitance of device 14. Typically $C_{DG}$ is about one-fourth and $C_L$ is about three-fourths of the total; so that $C_L = 3C_{DG}$.

Capacitor $C_S$ represents a source of static charge or other spurious voltage which, if applied to output terminal 11 (and, thus, to drain electrode 16), could rupture the gate dielectric of device 14. $R_S$, in series with $C_S$, represents the source impedance of the static source.

In order to selectively control the feedback voltage level on gate electrode 15, in accordance with the present invention, a clamping capacitor 19 has one terminal thereof connected to a suitable reference source, e.g. ground, and another terminal connected through the source-drain conduction path of a switching MOS device 20 to gate electrode 15 of the MOS device 14. Gate electrode 21 of device 20 is connected to supply voltage source $-V_D$.

Typically, the driver circuit is fabricated in an integrated circuit MOS chip, and a fragmentary portion of such a chip is shown by dashed line 22. In one application, the MOS cchip may provide operating circuits for a hand-held calculator, and the driver circuit provides output signals via line 23 for driving the calculator display or other apparatus external to the MOS chip.

The MOS devices 14 and 20 are of the P-channel, enhancement-mode, insulated-gate (IGFET) type; however, this is by way of example only and other types of devices, such as N-channel, could be employed. For the P-channel devices, the supply voltage sources $-V_0$ and $-V_D$ provide voltage levels which are negative relative to ground, for example –30 volts and –15 volts, respectively. The voltage sources may be derived from a potential source external to the chip. When the voltage source $-V_0$ is connected to load resistor 18 and voltage source $-V_D$ is connected to gate electrode 21 of device 20 the MOS chip is energized for operation. When sources $-V_D$ and $-V_D$ are disconnected, the chip is de-energized.

When the chip is energized for operation, binary input voltage levels for controlling the driver circuit are supplied to input terminal 12 (and thus to gate electrode 15) by the prior circuit stage 13. Stage 13 may comprise, for example a conventional MOS memory cell providing either one of two binary output voltage levels as a function of binary logic information stored in the cell. For the case of P-channel MOS devices, as herein employed, ground potential is arbitrarily designated in binary zero level while a negative voltage level is designated a binary one level.

Since device 14 is connected as an inverter, a negative voltage level (binary one) established at the gate electrode 15 thereof in excess of the device threshold voltage turns on device 14 to produce a current path between source electrode 16 and drain electrode 17 to connect output terminal 11 to ground potential (binary zero). Conversely, a ground input voltage level (binary zero) at gate electrode 15 turns off device 14 whereby the voltage at output terminal 11 approaches the negative (binary one) level of source $-V_0$.

Gate device 24, shown as part of prior stage 13, controls application of the input voltage signals to the input terminal 12. Device 24 is rendered conductive by a clock signal $\phi$ selectively applied to the gate electrode thereof. When device 24 is conductive, the desired binary one or binary zero signal level is coupled through device 24 to input terminal 12. After the input terminal is established at the desired binary level, device 24 is turned off by removal of the clock signal $\phi$ to isolate the input terminal from the prior stage. As a result, the input terminal (and, thus, gate electrode 15) is thereafter electrically floating at the desired binary level.

In operation, device 24 is only turned on briefly by the clock signal $\phi$ and the binary input voltage level is established rapidly at input terminal 12. The transition of the output voltage level at output terminal 11 from one binary level to the other lags that of the input voltage level and, therefore, occurs in large part after the input terminal has been isolated by device 24. The transition of the output voltage is fed back across $C_{DG}$ to gate electrode 15, and since the gate electrode is floating, the fed back voltage may alter the gate voltage sufficiently to change the conduction of device 14 and produce an erroneous output signal.

Assume, for example, that device 14 is conductive by virtue of a binary one (negative) input level on gate electrode 15, so that output terminal 11 is held at a binary zero (ground) level. Gate electrode 15 is then switched to binary zero (ground) through device 24, after which device 24 is turned off by removal of clock signal $\phi$ to isolate gate electrode 15. The new ground level on gate electrode 15 turns off device 14 so that the output voltage level at output terminal 11 begins to increase negatively from ground potential toward $-V_0$. A fraction of this negative increase is fed back across $C_{DG}$ (Miller feedback) to gate electrode 15. If the fed back voltage boosts the gate voltage above the device threshold voltage, device 14 will erroneously turn on.

Capacitor 19, in effect, serves as an a.c. grounding capacitor when connected to the gate electrode 15 to reduce the feedback voltage build-up on gate electrode 15 for a given output voltage swing. Device 20 is always conductive when the chip is energized due to the fixed $-V_D$ level at its gate electrode. Thus, during operation of the driver circuit, capacitor 19 is always connected to gate electrode 15 to reduce the feedback voltage level thereat. In effect, there is a division of the voltage fed back across $C_{DG}$ and the parallel combination of capacitor 19 and $C_L$ which holds gate electrode 15 close to ground level. For example, assume capacitor 19 has a value equal to the total gate capacitance (i.e., equal to $C_{DG} = C_L$) and that $C_L = 3C_{DG}$. The voltage fed back to the gate electrode 15 across $C_{DG}$ equals the output voltage swing multiplied by the fraction $C_{DG}/(C_{DG} + C_L + C_{19})$ from which it is apparent that the fraction of the output voltage fed back to the gate electrode 15 will be one-eighth with capacitor 19 connected to gate electrode 15 as compared to one-fourth without capacitor 19. As a result, capacitor 19 serves to hold gate electrode 15 closer to ground potential so that device 14 is less likely to turn on. It will be understood that the value of capacitor 19 may be varied to set the feedback voltage level at any desired value.

When the MOS chip is de-energized, the $-V_D$ voltage source is disconnected, as mentioned previously, which renders switching transistor 20 non-conductive and, thus, isolates capacitor 19 from gate electrode 15.

It is during periods when the chip is de-energized and the driver circuit is de-energized that device 14 is most susceptible to damage from static charge or other spurious signals supplied by a static source $C_S$ to output terminal 11. However, by virtue of the present invention, isolation of capacitor 19 when the chip is de-energized causes a larger fraction of any static charge applied to drain electrode 16 to be fed back to gate electrode 15. As a result, the gate voltage level will reach the device threshold voltage more rapidly thereby turning on the device 14 sooner to discharge the spurious signal at drain electrode 16 through the drain-source conduction path of device 14 to ground level. This protection scheme allows device 14 to withstand spurious static voltage levels of approximately twice the level of a circuit which does not use the present invention.

The specific component values and voltage levels will depend, of course, on the particular circuit application and may vary widely. In the preferred embodiment, the output voltage swing at drain electrode 16 for normal driver operation approaches thirty volts, and the device 14 threshold voltage is approximately four volts. Thus, for the example given, with capacitor 19 connected through device 20 to gate electrode 15, the voltage fed back to gate electrode 15 would be approximately $30 \times ⅛ = 3.7$ volts which is less than the device threshold level and is, thus, insufficient to turn on device 14. Thus, the driver circuit is able to drive the output terminal 11 to the full output signal level. Moreover, when the MOS chip is de-energized, thus turning off device 20 to isolate capacitor 19, a larger fraction of the output voltage (one-fourth compared to one-eighth or about 7.5 volts in the example given) is fed back to the gate electrode 15. As a result, if a static voltage source $C_S$ is connected to the output terminal 11, the increased feedback voltage will turn on device 14 more quickly to discharge the static voltage before it reaches a level sufficient to rupture the gate dielectric of device 14.

It will be evident that, while a specific embodiment of the invention has been illustrated and described, changes and modifications may be made without departing from the spirit and scope of the invention.

We claim:

1. In combination:

an MOS device having gate, source and drain electrodes operative when energized to supply an output voltage signal at said drain electrode in response to a received input voltage signal at said gate electrode;

static charge storage means connected to said drain electrode;

capacitance means;

switching means for selectively connecting said capacitance means to said gate electrode of said MOS device so as to minimize voltage feedback across the drain to gate junction of said MOS device when the device is energized and to isolate said capacitance means from said gate electrode so as to increase voltage feedback across the drain to gate junction of said MOS device in order to protect said MOS device from spurious voltage signals resulting from said static charges applied to said drain electrode when said MOS device is de-energized; and means for supplying a control voltage to said switching means to control the operation thereof.

2. The combination of claim 1, wherein said output voltage signal at said drain electrode is mutually different from said input voltage signal received at said gate electrode when said MOS device is energized.

3. A driver circuit having input and output terminals and subject to the application of spurious voltage signals at said output terminal resulting from static charge and the like comprising:

a driver insulated-gate field effect transistor having a gate electrode connected to said input terminal, a drain electrode connected to said output terminal, and a source electrode connected to a reference voltage source;

said driver transistor having a source-drain conduction path controlled by input voltage signals at said gate electrode for establishing output voltage signals at said drain electrode, said driver transistor further having capacitance connected between said drain and gate electrodes which is operative to feed back to said gate electrode a fraction of the voltage signal at said drain electrode;

capacitance means for connection to said reference voltage source and to said gate electrode for reducing the fraction of said output voltage signal fed back to said gate electrode;

switching means connected to said last mentioned capacitance means and to said gate electrode for selectively connecting said capacitance means to said gate electrode; and means for controlling said switching means for isolating said capacitance means from said gate electrode when said driver circuit is de-energized in order to increase the fraction of output voltage fed back to said gate electrode, whereby an increased fraction of any spurious voltage signal at said drain electrode from static charge or the like is coupled to said gate electrode for more rapidly rendering said transistor conductive to discharge said spurious voltage signal therethrough along said source-drain conduction path to said reference voltage source.

4. The driver circuit of claim 3 wherein said switching means is a switching insulated gate field effect transistor having the source-drain path thereof connected between said capacitance means and said gate electrode of said driver transistor.

5. The driver circuit of claim 4 wherein said wherein said switching transistor has a gate electrode connected to receive a fixed voltage level for rendering said switching transistor conductive while said driver circuit is energized.

6. The driver circuit of claim 4 wherein said driver insulated-gate field effect transistor and said switching insulated gate field effect transistor are each of the same conductivity type.

7. The driver circuit of claim 3, including source means connected to said input terminal through input switching means in order to selectively supply the gate electrode of said driver transistor with an input voltage signal to thereby control the operation of said driver transistor.

8. The driver circuit of claim 7 wherein said input switching means is a field effect transistor having source, gate and drain electrodes, said source and drain electrodes forming a conduction path therebetween to electrically connect said last mentioned source means to the gate electrode of the driver transistor through said input terminal when said input switching means is rendered conductive, said driver transistor gate electrode isolated from said last mentioned source means when said input switching means is rendered non-conducting whereby said driver transistor gate electrode electrically floats at the voltage of said input signal.

* * * * *